(12) United States Patent
McDonald et al.

(10) Patent No.: US 7,436,867 B2
(45) Date of Patent: Oct. 14, 2008

(54) HERMETICALLY SEALED EXTERNAL CAVITY LASER SYSTEM AND METHOD

(75) Inventors: Mark McDonald, Milpitas, CA (US); Richard A. Becker, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 1011 days.

(21) Appl. No.: 10/305,460

(22) Filed: Nov. 27, 2002

(65) Prior Publication Data

US 2004/0101016 A1    May 27, 2004

(51) Int. Cl.
  *H01S 3/13* (2006.01)
(52) U.S. Cl. .............. 372/29.022; 372/26; 372/100
(58) Field of Classification Search .......... 372/92, 372/18, 19, 32, 29.01, 29.022
  See application file for complete search history.

(56) References Cited

U.S. PATENT DOCUMENTS

| | | | | |
|---|---|---|---|---|
| 4,402,720 A | * | 9/1983 | Edahiro et al. | 65/391 |
| 4,611,089 A | * | 9/1986 | Elsner et al. | 136/230 |
| 5,497,937 A | * | 3/1996 | Yoshikawa et al. | 228/205 |
| 5,530,714 A | * | 6/1996 | Vilhelmsson et al. | 372/92 |
| 6,282,222 B1 | * | 8/2001 | Wieser et al. | 372/74 |
| 6,366,592 B1 | * | 4/2002 | Flanders | 372/18 |
| 6,591,023 B1 | * | 7/2003 | Schunk | 385/1 |
| 6,788,724 B2 | * | 9/2004 | Sell et al. | 372/92 |
| 2003/0103545 A1 | * | 6/2003 | Julliard et al. | 372/109 |
| 2003/0223471 A1 | * | 12/2003 | Baney | 372/92 |
| 2005/0074047 A1 | * | 4/2005 | Boggy et al. | 372/69 |

* cited by examiner

*Primary Examiner*—Dung T Nguyen
(74) *Attorney, Agent, or Firm*—Blakely, Sokoloff, Taylor & Zafman LLP (57) ABSTRACT

A laser apparatus in a hermetically sealed container and methods for hermetically sealing the laser. The laser apparatus comprising an external cavity laser and a modulator in a single hermetically sealed enclosure.

46 Claims, 8 Drawing Sheets

HERMETICALLY SEALED EXTERNAL CAVITY LASER SYSTEM AND METHOD

TECHNICAL FIELD

The present invention relates generally to lasers, and in particular, but not exclusively, to sealed external cavity lasers.

BACKGROUND

There is an increasing demand for tunable lasers for test and measurement uses, wavelength characterization of optical components, fiber optic networks and other applications. In dense wavelength division multiplexing (DWDM) fiber optic systems, multiple separate data streams propagate concurrently in a single optical fiber, with each data stream created by the modulated output of a laser at a specific channel frequency or wavelength. Presently, channel separations of approximately 0.4 nanometers in wavelength, or about 50 GHz in frequency are achievable, which allows up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels.

Continuously tunable external cavity lasers have been developed to overcome the limitations of individual DFB devices. Various laser tuning mechanisms have been developed to provide external cavity wavelength selection, such as mechanically tuned gratings used in transmission and reflection. External cavity lasers must be able to provide a stable, single mode output at selectable wavelengths while effectively suppressing lasing associated with external cavity modes that are within the gain bandwidth of the cavity. These goals have been difficult to achieve, and there is accordingly a need for an external cavity laser that provides stable, single mode operation at selectable wavelengths.

Traditionally, the laser and an "external" modulator were packaged in separate hermetically sealed packages and interconnected with a significant length of PM fiber. This system is disadvantageous, as it requires two hermetically sealed packages—one for the modulator, and one for the external cavity laser. Failure of either hermetically sealed package results in a potentially catastrophic failure of the entire device. Use of a long PM fiber, often 1 m is used to connect the modulator to the external cavity laser, which requires a substantially larger footprint then is preferable.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus and method for hermetically sealing an external cavity laser are described herein. Numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics can be combined in any suitable manner in one or more embodiments.

The invention provides a laser apparatus in a hermetically sealed container and laser methods using hermetically sealed laser systems. In its most general terms, the apparatus of the invention comprises an external cavity laser, a modulator, and a hermetically sealable container configured to enclose the external cavity laser and modulator in an inert atmosphere. The external cavity laser can be tunable by various mechanisms to allow transmission at multiple selectable wavelength channels.

The external cavity laser can comprise a gain medium and an end mirror. The gain medium can comprise a diode emitter chip including first and second output facets, with an antireflective coating on the second output facet. The first output facet and the end mirror define an external cavity, with the gain medium emitting a coherent beam from the second output facet along an optical path in the external cavity to the end mirror. A channel selector or like tunable element can be positioned within the external cavity in the optical path between the end mirror and the emitter chip. The gain medium emits a second beam from first output facet along an optical output path to the modulator.

The hermetically sealable container encloses the modulator and the external cavity laser, including the end mirror, the gain medium, and the wavelength selection element. Hermetically sealing the external cavity laser under an inert atmosphere protects the anti-reflective (AR) coating on the gain medium, as well as surfaces on the wavelength selection element and other optical components. The deposition of contaminants onto the optical surfaces of components associated with an external cavity laser, which can occur in the absence of hermetic sealing, causes aberrations which hinder the performance of the external laser cavity and promote degradation of critical optical surfaces. Hermetically sealing the external cavity laser as provided by the invention allows for a controlled environment that prevents corrosion and contamination of the optical surfaces of the laser. Hermetically sealing the modulator within the same hermetic enclosure as the external cavity laser provides a small laser package compared to hermetically sealing the modulator separately.

Tunable external cavity lasers usable with the invention can comprise a grid generator, a tuning assembly configured to adjust the end mirror, a channel selector, and various other components involved in tuning and laser operation. Many of these components can have high out-gassing characteristics during laser operation, such that volatile hydrocarbons can contaminate and/or cause degradation of various optical surfaces of the external cavity laser. In this regard, the external cavity laser is configured to minimize or eliminate problems associated with out-gassing by lubricants, adhesives, cable insulators and other components or materials which contain volatile compounds and residual moisture by carefully selecting materials and minimizing the use of potentially out-gassing materials.

In one embodiment, the modulator and the external cavity are positioned in a hermetically sealable container in a straight in-line configuration. An optical output assembly is positioned in the optical output path between the first facet of the gain medium and a first end of the modulator. The optical output assembly can comprise a collimating lens, an optical isolator and a focusing lens, which focuses the optical output beam into a fiber stub operatively coupled to the first end of the modulator. The fiber stub is much shorter than conventional fiber utilized to connect the output from the external cavity laser to the modulator, which allows the packaging of both the external cavity laser and the modulator into one hermetically sealable container. The fiber stub is short (e.g., several mm), and has been previously aligned to the input waveguide of a modulator, such as a LiNO$_3$ modulator. The fiber can be a polarization-maintaining (PM) fiber, but can optionally be a standard single-mode (SM) fiber owing to the short length and approximately straight path. The end of the fiber stub that is not attached to the LiNbO$_3$ modulator is held in a ferrule and is aligned to the output from the External Cavity Diode Laser (ECDL) via the output assembly. The ferrule and ECDL can be connected to a common mechanical frame, which can be mechanically stiff and thermally uniform to preserve coupling efficiency over a wide range of environmental conditions. The short length of the fiber stub lends compliancy, so that the modulator can be mechanically decoupled from the ECDL while preserving good beam coupling into the modulator waveguide.

In other embodiments, the modulator and the external cavity can be positioned in a hermetically sealable container in a parallel configuration. The modulator is able to be positioned substantially parallel to the external cavity laser by positioning reflective surfaces in the optical output path to change the direction of the path of the light beam along the optical output path by approximately 180° prior to being focused into the fiber stub coupled to the modulator. The reflective surfaces can comprise a prism assembly or individual reflective elements in the optical output path. The parallel configuration of the external cavity laser and the modulator, like the in-line configuration, provides a compact laser package and eliminates problems with joining the two components by using a long PM fiber.

An alternative embodiment allows the beam along the optical output path to be delivered by free space to a modulator waveguide, when the proximate waveguide facet is constrained spatially but the distal waveguide facet is permitted to have soft mounting. In another alternative embodiment, the beam can be delivered by free space using optics that reduce sensitivity to misalignment, such as roof prisms, and beam guide optics that maintain a paraxial identical matrix in ray optics in one or two dimensions. In another embodiment, a receiver can also be positioned in the hermetically sealable container along with the external cavity and modulator.

In certain embodiments, one or more activated carbon drains are sealed within the hermetically sealed enclosure and positioned to collect volatile hydrocarbons produced by outgassing from components of the external cavity laser. The activated carbon drain has a large surface area of activated carbon that allows for adsorbing or trapping the out-gassing volatile organic compounds released during the operation of the laser. Organic hydrocarbon materials released from epoxies and lubricants used during assembly of the external cavity laser, or used to seal the hermetically sealable enclosure, are also trapped by the activated carbon drain. The activated carbon drain allows the optical surfaces of the tunable external cavity laser in the hermetically sealed enclosure to remain free of organic contaminants that could otherwise hinder performance.

In other embodiments, one or more moisture traps can be included within the hermetically sealable container and positioned to collect water vapor that can outgas from polyimide or other moisture-holding insulation or material present in the external cavity laser. Such out-gassed water vapor, if not trapped, can condense on critical optical surfaces and reduce performance of the external cavity laser, and can promote corrosion of components. Moisture condensation is a particular concern after "cool down" periods when the laser has not been in use. The material of the moisture trap can comprise a variety of desiccants. The moisture trap prevents condensation of water on optical surfaces and elsewhere that would otherwise reduce performance of the external cavity laser and promote corrosion of components within the hermetically sealed enclosure.

In one embodiment, the inert atmosphere sealed within the hermetically sealed container comprises nitrogen. Other inert gases can also be used, such as helium, argon, krypton, xenon, or various mixtures thereof, including a nitrogen-helium mix, a neon-helium mix, a krypton-helium mix, or a xenon-helium mix. Helium can be added to the inert atmosphere to allow for testing and monitoring the level of hermeticity of the sealed container. The inert gas or gas mix included within the hermetically sealed container can be selected for a particular refractive index or other optical property.

In certain embodiments, the inert atmosphere sealed within the hermetically sealed container is selected for its thermal properties; the atmospheric fill gas can be chosen to minimize heat transfer to and from laser components within the hermetically sealed enclosure to further control the temperature of the laser device. In certain embodiments where the laser apparatus is thermally controlled, the heat transfer to temperature controlled components from the surrounding atmosphere increases power drawn by the temperature controller (e.g., a thermoelectronic controller (TEC)) and introduces temperature gradients that can degrade performance and make more difficult the temperature estimations necessary for controlling and monitoring the laser apparatus. An appropriate choice of atmosphere surrounding components reduces power required to maintain the temperature of the device (e.g., a vacuum or a gas with thermal insulating properties), and power required to actuate a temperature change of the device (e.g., a gas with low heat capacity).

Typically, fill gas utilized in hermetically sealed enclosures are chosen for inertness and availability as a desiccant. For example, 1 ATM of $N_2$ is a typical fill gas for a hermetically sealed laser apparatus. Some applications employ a trace gas such as Helium (He) for monitoring the hermetic seal of the enclosure. These gases are not known for thermal insulation. In fact, Helium is known to promote heat transfer.

In some embodiments, the fill gas is chosen for inertness, reduced thermal conduction and low heat capacity, and for transparency at operating wavelengths if atmosphere is used in free space transmission. Typically gases with high molecular weight have low thermal conductivity. Relatively simple gas molecules are preferred because of their low heat capacity. High atomic number noble gases are good choices in this application, but other gases with high molecular weight (e.g., $CO_2$, $SF_6$, freons) can also be used. Use of a fill gas with reduced thermal conduction minimizes heat transfer, provides for lower electrical power consumption, and minimizes thermal cross-talk between components regulated to different temperatures. Use of a fill gas with low heat capacity minimizes peak power required to actuate a component temperature change in a fixed time. In other embodiments, gasses with different thermal characteristics can be selected. For example, a gas with a high thermal conductivity can be selected to provide adequate thermal dissipation in non-TEC or un-cooled applications, and a gas with a high heat capacity can be selected to reduce the effect of ambient thermal shocks on the apparatus.

The apparatus of the invention can also comprise a sacrificial surface located within the hermetically sealed enclosure on which both condensation and volatile hydrocarbons from out-gassing can be trapped to avoid contamination of the optical surfaces of the tunable external cavity laser. The sacrificial surface is configured to remain cooler than surrounding surfaces during laser operation, and can be actively cooled by a cooling source and/or be made of material which provides passive cooling by acting as a heat sink which will attract volatile hydrocarbons and water vapor.

In certain embodiments, selective heating of important optical surfaces can be employed to prevent condensation of contaminants thereon. Such heating can be employed during cool-down periods when the gain medium is not powered, to prevent condensation when the external cavity laser is not in use. One or more heat sources, either positioned inside or outside the hermetically sealed enclosure, can be used to heat the gain medium of the external cavity laser when the gain medium is not powered to maintain a relatively high temperature for the anti-reflective coating on the output facet of the gain medium and to prevent condensation thereon when the laser is not in use. Heating in this manner can also be used in connection with the end mirror, tunable elements or other components with sensitive optical surfaces to maintain a temperature higher than the activated carbon drain, moisture trap and/or the sacrificial surface present in the hermetically sealed container, to further prevent the contamination of these optical surfaces.

In some embodiments the gain medium and the optical elements in the external cavity are mounted on a thermally conductive substrate for laser tuning as well as to prevent condensation of contaminants thereon. Output components such as an optical output assembly can also be mounted on the same thermally conductive substrate as the gain medium or on a separate thermally conductive substrate to optimize laser output and also to protect the optical surfaces from condensation and deposition of hydrocarbons caused by out-gassing.

The invention can be embodied in a laser system which comprises an optical fiber extending into the hermetic container through a hermetic fiber optic feedthrough and optically coupled to the modulator which is operatively coupled to an output facet of the external cavity laser to receive optical output therefrom. The hermetically sealable container can vary in configuration, but will generally be configured such that the optical fiber can be feed through a side of the container. Various electrical leads necessary for operation of the external cavity laser can extend into the hermetic container through hermetic feed-throughs in the sides of the hermetic enclosure.

FIGS. 1-7 illustrate various embodiments of the invention, although the apparatus can vary as to configuration and as to details of the parts, and the method can vary as to details and the order of the acts, without departing from the basic concepts as disclosed herein. The invention is disclosed primarily in terms of a hermetically sealed modulator and external cavity diode laser (ECDL) package and a method of hermetically sealing the modulator and ECDL. The invention, however, can be used with various types of laser devices and optical systems. The relative sizes of components and distances therebetween as shown in the drawings are in many instances exaggerated for reason of clarity, and should not be considered limiting. Any definitions herein are provided for reason of clarity and should not be considered limiting, and any technical and scientific terms used herein are intended to have the same meaning as commonly understood by those skilled in the art. It should also be understood that the terminology used herein is for the purpose of describing particular embodiments only, and is not intended to be limiting, since the scope of the present invention will be limited only by the appended claims.

Figure 1:
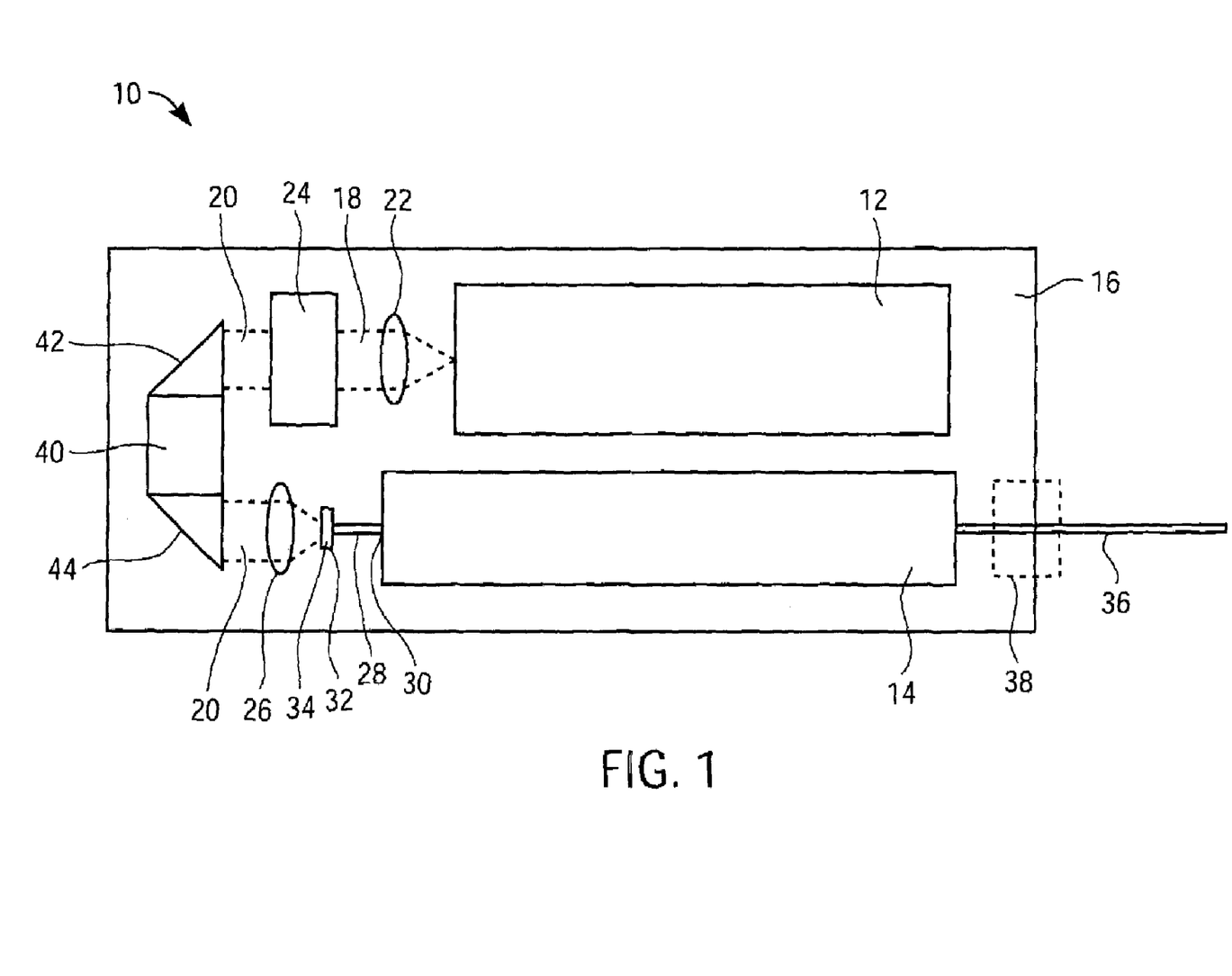
FIG. 1 is a schematic top view of a laser apparatus with the modulator in a parallel configuration to the External Cavity Diode Laser (ECDL) in accordance with the invention.

FIG. 1 illustrates a laser apparatus 10 comprising an external cavity laser 12 and a modulator 14 enclosed in a hermetically sealed container 16. The external cavity laser emits an output beam 18 along an optical output path 20, and the modulator 14 is positioned in optical output path 20 to allow modulation of the output beam 18. The laser apparatus 10 comprises a collimating lens 22, an optical isolator 24, and a focusing lens (e.g., a second collimating lens) 26 positioned in the optical output path 20 between the external laser cavity 12 and the modulator 14. The focusing lens 26 focuses the beam 18 along optical output path 20 into a fiber stub 28, which is coupled to modulator 14. The fiber stub 28 comprises a first end 30 and a second end 32, the first end 30 being coupled to modulator 14 and the second end 32 of the fiber stub 28 being operatively coupled to a fiber stub ferrule 34 which aligns the fiber stub 28 to the output beam 18 along optical output path 20. The fiber stub ferrule 34 is mounted to the hermetically scalable container 16 to insure the coupling and correct alignment of the output beam 18 from the external cavity laser 12 into the fiber stub 28. The modulator 14 is aligned with the fiber stub 28 to provide modulation of the optical output beam 18, and is configured to couple the optical output beam 18 into an optical fiber 36. Optical fiber 36 is fed through second ferrule 38, which is usually positioned within a wall of the hermetically sealed enclosure 16.

The external cavity laser 12 and the modulator 14 of laser apparatus 10 are mounted on a surface of the hermetically sealable container 16 in a substantially parallel configuration. Positioned between the optical isolator 24 and the focusing lens 26 is a prism assembly 40 comprising a first reflective surface 42 and second reflective surface 44. The reflective surfaces 42 and 44 are configured to change the direction of light beam 18 along optical output path 20 by approximately 180°, enabling modulator 14 to be positioned and mounted in the hermetically sealable enclosure 16 adjacent and substantially parallel to the external cavity laser 12. The parallel arrangement of the external cavity laser 12 and the modulator 14 provide laser apparatus 10 with a small footprint, which is more cost effective.

Container 16 includes a lid (not shown) that hermetically seals the container to enclose the external cavity laser 12 and the modulator 14 within container 16. The lid can have a flat, rectangular configuration such that it generally conforms to the shape of container 16. The lid can be plated or coated with an oxidation resistant metal or metal alloy such as Ni/Au designed to bond to container 16 by fusing, soldering or other hermetic sealing technique.

The modulator 14 can be any of various types of modulators; examples of modulators useful in the invention are a Mach-Zehnder modulator, a directional coupler modulator, an electroabsorption modulator, an X coupler modulator, an acousto-optic (diffraction) modulator, and a micromechanical modulator. The modulator can be fabricated from materials such as $LiNbO_3$.

The external cavity laser 12 in FIG. 1 can be a fixed-wavelength laser or tunable laser which can comprise either a conventional straight gain medium or a gain medium in a bent wave guide configuration (not shown in FIG. 1). The external cavity laser 12 can be mounted on a thermally conductive substrate (not shown) to provide thermal tuning of the external cavity laser, as well as to prevent condensation of particulates on external cavity laser optics 12 during shutdown periods.

Figure 2:
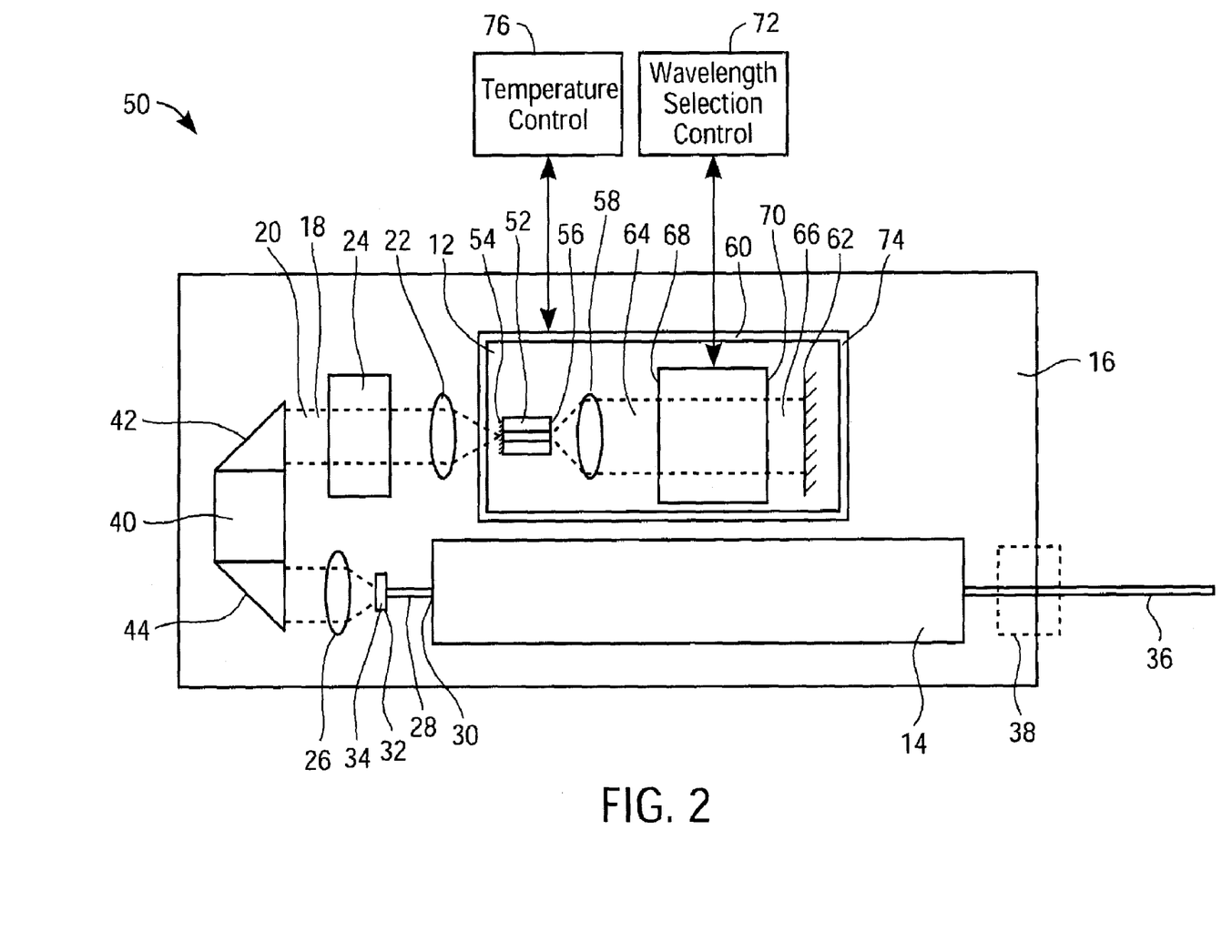
FIG. 2 is a schematic top view of a laser apparatus with the modulator in a parallel configuration to a tunable ECDL in accordance with the invention.

FIG. 2 illustrates a schematic top view of a tunable laser apparatus 50 comprising an ECDL 12 and a modulator 14 in a parallel configuration. The ECDL 12 comprises a straight gain medium 52 with first (rear) and second (front) facets 54 and 56, a collimating lens 58, a wavelength section element 60 and an end reflector 62. The gain medium can comprise a laser diode emitter, a flash lamp pumped laser dye gain medium or crystal gain medium, a gas medium that is pumped electrically, or some other form of gain medium. Reflective element 62 can comprise a mirror, prism, grating or other reflective or retroreflective element. The rear facet 54 of gain medium 52 and the end mirror 62 define the external cavity path length.

Gain medium 52 emits a light beam 64 from facet 56, which is collimated by lens 58 along optical path 66 towards reflector 62, which is positioned in path 66. A wavelength selection element 60 is included in the laser apparatus 50 and is shown positioned in optical path 66 between gain medium 52 and end reflector 62. Wavelength selection element 60 can comprise one or more etalons, gratings, prisms or other element or elements that are capable of providing feedback to gain medium 52 along path 64 at a selected wavelength. In the embodiment shown in FIG. 2, wavelength selection element 60 is shown as an etalon with faces 68, 70 and operates as a Fabry-Perot interference filter. Wavelength selection element 60 is configured to have a free spectral range, such that the interference between faces 68 and 70 results in a single transmission peak within a wavelength range of interest such as, for example, the gain bandwidth of gain medium 52, the wavelength range of the C-band ITU (International Telecommunications Union) grid (approximately 32 nanometers), or other wavelength range.

The single transmission peak provided by wavelength selection element 60 allows feedback of light at the transmission peak wavelength, while suppressing potential feedback at other wavelengths. The feedback can arise due to modes associated with the external cavity defined by gain medium facet 54 and end reflector 62, due to transmission maxima associated with a grid generator etalon (not shown) that can be present within the external cavity, or due to other wavelength at which feedback is not desired. The finesse of wavelength selection element 60 can be configured as needed to provide for effective suppression of feedback within the external cavity at wavelengths other than the single transmission peak defined by the wavelength selection element.

A wavelength selection controller 72 is operatively coupled to wavelength selection control element 60, and provides control signals thereto for adjustment or selection of the wavelength of the transmission peak defined by the wavelength selection element 60, and hence the wavelength of light that is fed back to gain medium 52. Wavelength selection element 60 can be tunable by various mechanisms to adjust the wavelength of the light that is returned to gain medium 52 along path 66. Examples include thermo-optic, electro-optic, acousto-optic, and piezo-optic tuning, mechanical angle tuning, strain-based tuning, other tuning mechanism or combination of tuning mechanisms. Other types of wavelength selection elements and tuning mechanisms therefore can suggest themselves to those skilled in the art and are considered to be within the scope of this disclosure.

The optical surfaces of external cavity laser 12 within hermetic container 16 that are sensitive to contaminants such as moisture and volatile organics or hydrocarbons include, but are not limited to, the AR coated facet 56 of the gain medium 52, the end mirror 62, the reflective faces 68 and 70 of the wavelength selection element, and the surface of collimating lens 58. Other important optical surfaces of the external cavity laser 50 which are sensitive to contamination include optical surfaces of the optical isolator 24, prism element 40 and additional collimating components in output path 20. Hermetically sealing the external cavity laser 16 and modulator 14 within hermetically sealable container 16 protects the external cavity laser 12 and other sensitive components by placing the telecommunication laser apparatus 50 in a controlled environment.

In the embodiment shown in FIG. 2, the external cavity laser 12 is mounted and thermally coupled to a thermally conductive platform 74 and is thermally controlled by a thermoelectronic controller (TEC) 76. By thermally controlling the ECDL 12, the optical surfaces of the ECDL are less likely to become contaminated. The thermally conductive platform 74 provides a heat source which can be used when gain medium 52 is un-powered to heat gain medium 52 to maintain an elevated temperature for the anti-reflective coating on the output facet 56, and to prevent condensation thereon when external cavity laser 12 is not in use. As shown, thermoelectric controller 76 is coupled to gain medium 52 and to thermally conductive platform 74. Thermoelectric controller 76 can also be used during operation of gain medium 52 to thermally control the optical thickness across gain medium 52 between facets 54, 56. One or more additional heating elements (not shown) can be positioned internally or externally to the hermetically sealed enclosure 16 to maintain elevated temperatures for selected components to prevent condensation of contaminants thereon. Thus, heating can be used in connection with the end mirror 62 or wavelength selection element 60 to maintain a temperature higher than an activated carbon drain (not shown), moisture trap (not shown), and/or sacrificial surface (not shown), and to prevent the contamination of optical surfaces 68, 70.

Figure 3:
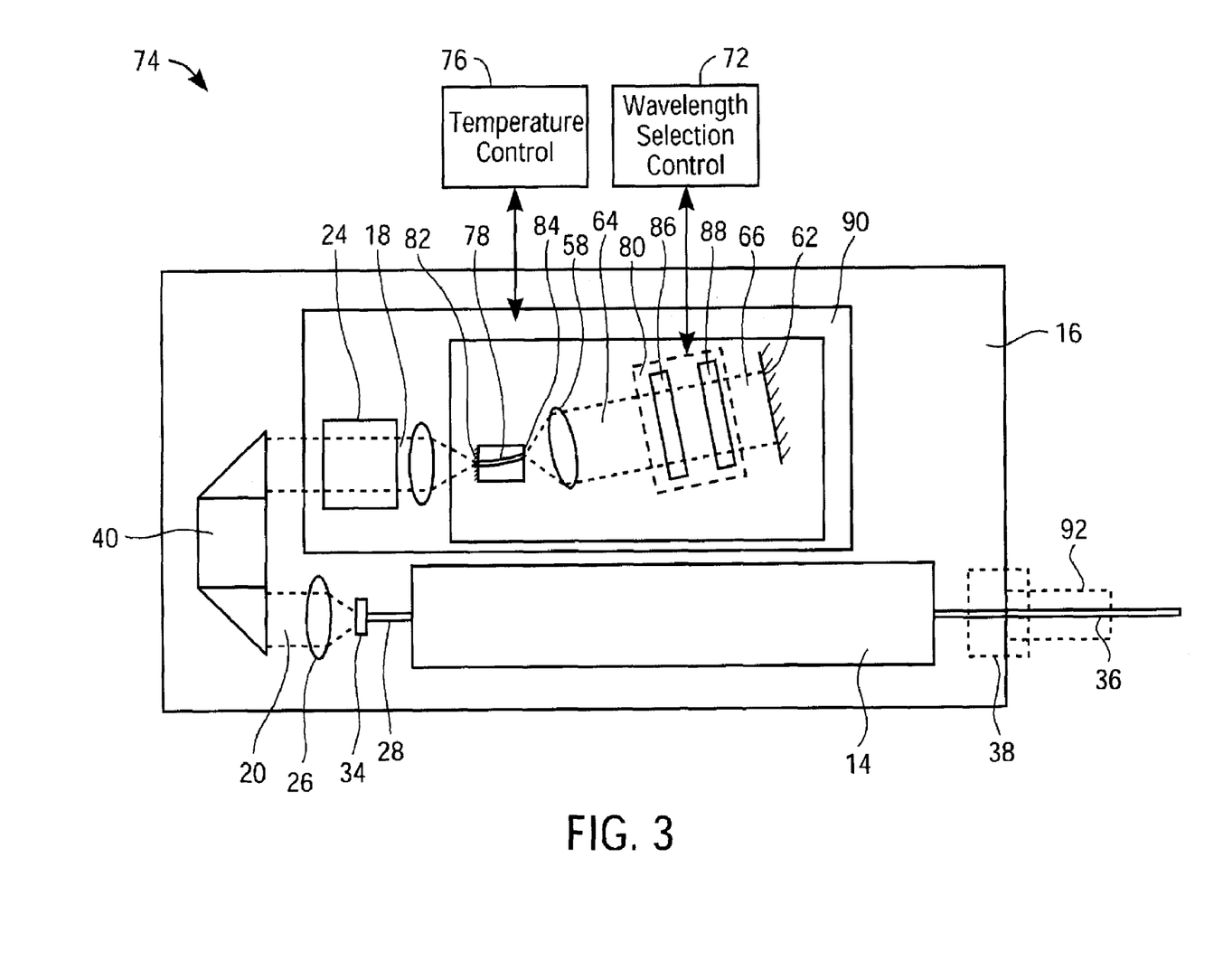
FIG. 3 is a schematic top view of a laser apparatus with the modulator in a parallel configuration to a tunable ECDL comprising a bent wave guide in accordance with the invention.
Figure 4:
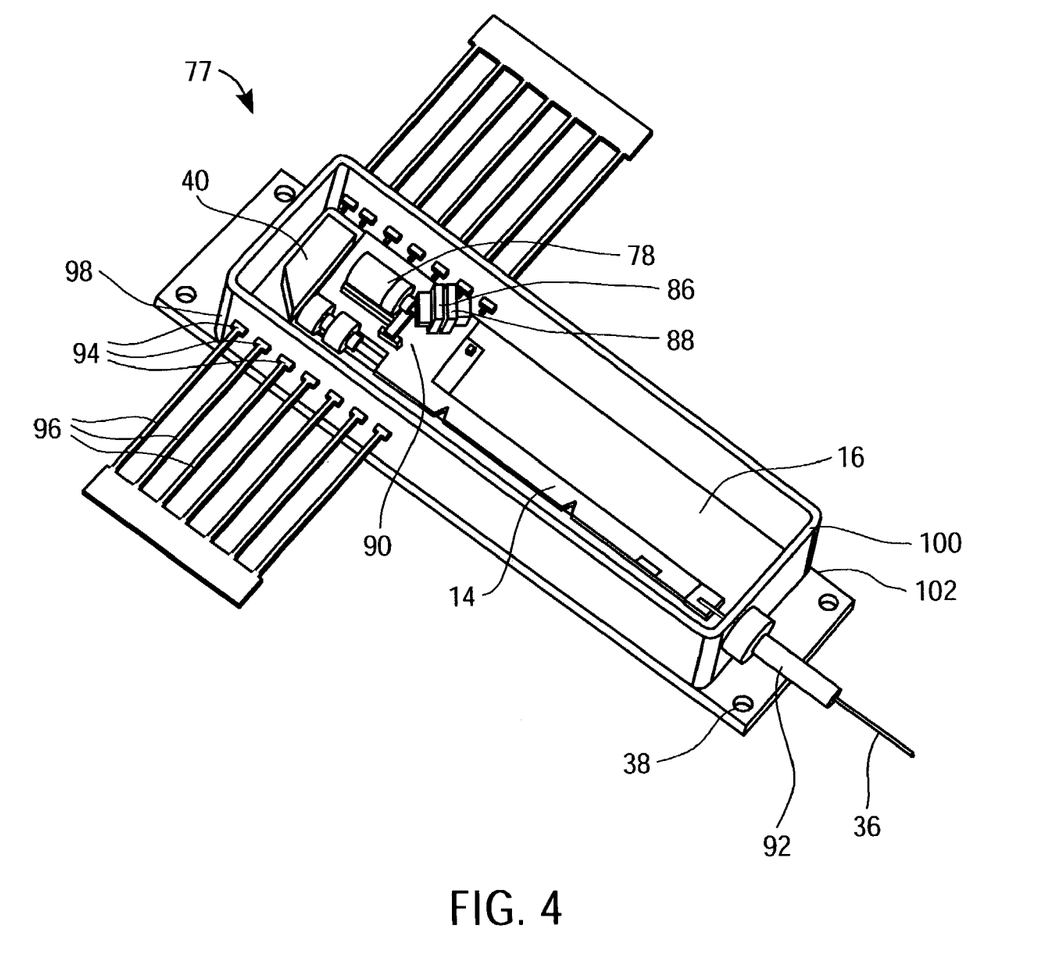
FIG. 4 is a perspective view of the laser apparatus shown in FIG. 3 in accordance with the invention, shown with the cover removed.

FIGS. 3 and 4 illustrate an embodiment of an external cavity laser apparatus 77. Laser apparatus 77 comprises an ECDL 12 and a modulator 14 in a parallel configuration, the ECDL comprising a bent wave guide gain medium 78 and a thermo-controlled wavelength selection element 80.

In the apparatus 77, a bent waveguide gain medium 78 is utilized, with non-parallel facets 82 and 84 emitting light beams 18 and 64 respectively along paths 20 and 66, which are not co-linear due to the configuration of gain medium 78. Bent waveguide gain medium 78 helps prevent unwanted return of direct reflectances from facet 84 from returning to gain medium 78. Beam 64 is collimated by lens 58 along path 66 to wavelength selection element 80 and end reflector 62 as noted above, and beam 18 is collimated by lens 22 along path 20 through optical isolator 24, the 180 degree prism element 40, and then focused into fiber stub 28 by lens 26 through ferrule 34. The beam passes through the fiber stub 28 to the modulator 14 and then to optical fiber 36, which is hermetically sealed by ferrule 38. Isolator 24, lenses 22, 26 and 58, gain medium 78, wavelength selection element 80, and end reflector 62 are each mounted on or coupled to a common thermally conductive platform 90.

Wavelength selection element 80 can comprise etalons, gratings, or prisms in various combinations as noted above, and can be tunable by thermo-optic, electro-optic, acousto-optic, and piezo-optic tuning, mechanical angle tuning, strain-based tuning, or other tuning mechanisms as noted above. As shown in FIGS. 3 and 4, wavelength selection element 80 includes etalons 86 and 88 that can comprise a thermo-optic material such as silicon or other semiconductor material, and tuning elements which can comprise thermo electric control elements which adjust etalon free spectral range via temperature induced change in etalon material refractive index and/or temperature-induced change in etalon thickness.

In some embodiments, external cavity tuning can be used in the apparatus 77 to provide fine-tuning of a selected wavelength by optimizing the relationship of external cavity modes with the transmission peak of wavelength selection element 80. The external cavity modes can be adjusted by physical adjustment of the spacing between facet 82 and end reflector 62, and/or by adjusting the refractive index of material present in the external cavity. Semiconductor gain media materials such as InGaAs and InGaAsP have generally high refractive indices, and thus provide an important component of the overall external cavity optical path length. Gain media materials also exhibit relatively large changes in refractive index with respect to temperature, and gain medium refractive index adjustment can be effectively carried out by temperature control of gain medium 78.

Platform 90 comprises a thermally conductive material such as aluminum nitride and/or silicon carbide, to allow common thermal control of the various components of the apparatus 77. Gain medium 78 is thermally coupled to a thermoelectric controller 76 via thermally conductive platform 90. The temperature of gain medium 78 can be adjusted, and the refractive index of the gain medium (and hence external cavity optical path length) controlled by heating or cooling introduced from the thermoelectric controller. A temperature control element (not shown) can be operatively coupled to thermoelectric controller to provide control signals thereto to selectively adjust the temperature of gain medium 78 for external cavity optical path length adjustment.

Both gain medium 78 and end reflector 62 are mounted on platform 90, and the material of platform can be selected to provide a coefficient of thermal expansion such that heating and cooling of platform 90 provides a corresponding expansion and contraction of platform 90 to adjust the physical separation of gain medium facet 82 and end reflector 62, and hence provide adjustment of the external cavity optical path length. The adjustment of the spacing of gain medium 82 and end reflector 62 in this manner may be carried out together or simultaneously with the thermal adjustment of gain medium refractive index as described above. Alternatively, gain medium 78 may be thermally isolated from platform 90 such that thermal adjustment of external cavity optical path length is carried out by spacing of gain medium facet 82 and end reflector 62 alone.

A thermistor or other temperature sensor (not shown) can be included on platform 90 and operatively coupled to a control element to monitor the temperature of platform 90, so that if a deviation from a selected temperature is sensed by the thermistor, appropriate corrective temperature adjustment can be made by control element. Diode facets 82 and 84, as well as the surfaces of collimators 22 and 58, present several of the more important optical surfaces of the laser apparatus 77, and the inclusion of all of these components onto a single thermally controlled substrate 90 allows collective temperature control of the components to prevent condensation of moisture or outgassed volatile organic compounds on the optical surfaces.

Thermal control of the ECDL and optical output components also allows the use of temperature control to maintain the optimum alignment of the components on substrate 90. In this regard, the substrate 90 can be matched in CTE (coefficient of thermal expansion) to that of diode emitter 78. The use of thermal control on selected optical components as provided by substrate 90 and TEC 76 also minimizes the power requirements of the apparatus 77 by selectively heating only important optical components and optical surfaces.

Various other optical components can be subject to selective thermal control by mounting onto substrate 90 such as a grid generator and/or a coarse spectrometer (not shown). Many of the important optical surfaces of the apparatus 77 can be located on a distinct or separate temperature-controlled substrate. Placement of laser output elements on a substrate distinct and separate from the substrate or substrates supporting the other external cavity laser components allows excellent isolation of the output elements. In some embodiments, components of the ECDL 12 are coupled to thermally conductive substrate 90 while the optical output components are mounted on a distinct substrate or platform.

The hermetically sealed container 16 of laser apparatus 77 comprises an optical fiber feedthrough 92 and ferrule 38 for hermetically sealing the optical fiber 36 as it enters container 16, and at least one electrical feedthrough 94 for an electrical lead or interface 96 through the wall of the container 16 as shown in FIG. 4. Multiple electrical leads will typically pass into hermetic container 16 as described further below.

Holes 98 are provided in container 16 to allow hermetic sealing of electrical leads 96 extending therethrough by use of electric feedthroughs 94 (see, e.g., FIG. 4). Feedthroughs 94 comprise glass sleeves that fit into holes 98, and through which leads 96 fit. Feedthroughs 94 and leads 96 are hermetically fused into holes 98 by exposure to elevated temperature. The hermetic sealing of leads in this manner is carried out prior to inclusion of any heat sensitive components within container 16.

The hermetically sealable enclosure 16 is metal-plated to prevent rust or corrosion from arising after sealing the external cavity laser 12 and modulator 14 within enclosure 16. The hermetically sealed enclosure 16 can, for example, be made of a Ni—Fe—Co alloy or some other metal or metal alloy having good corrosion resistance and formability suitable for hermetic enclosures. Hermetic enclosure 16 is plated with gold or other corrosion-resistant metal or metal alloy to provide clean, corrosion-resistant surfaces. The enclosure 16 is metal plated under conditions that safeguard against possible contamination, such as class 100 or higher clean room conditions. Where possible, the use of adhesives is avoided within hermetic container 16 and fluxless solders are used for bonding. Circuit boards (not shown) are made of ceramic instead of fiberglass-reinforced resin to avoid out-gassing associated with resin-containing boards, and are attached directly to the container 16 by a fluxless solder process. The lid (not shown) of the hermetically sealed container conforms generally to the shape of container 16, and includes a Ni—Au plating to allow for hermetic sealing to container 16 to form a hermetically sealed enclosure about the laser apparatus 77 therewithin Hermetic sealing of the laser apparatus 77 is provided in association with optical fiber 36 by fiber feedthrough 92 and ferrule 38. The fiber feedthrough 92 is configured to hermetically seal the optical fiber 36. The outer jacket and inner jacket (not shown) of the optical fiber 36 are removed from the portion of the fiber 36 which extends into enclosure 16 to avoid out-gassing from the insulation material of the inner and outer jackets. A ferrule 38 extends through the wall of container 16, with fiber 36 extending through ferrule 38. On the inner side 100 (FIG. 4) of container 16, fiber 36 is hermetically fused in place by a solder plug (not shown). The optical fiber 36 and inner surface of ferrule 38 can be metallized to facilitate soldering. An epoxy plug holds fiber 36 in place adjacent the outer side 102 (FIG. 4) of container 16. The fiber feedthrough 92 is configured to provide pull stress support to the fiber to prevent damage from handling.

In the fabrication of the hermetically sealed external cavity laser apparatus 77, the use of lubricants, adhesives, cable insulators and other materials which contain volatile compounds and residual moisture is minimized to limit material out-gassing. Where possible, materials are selected to eliminate out-gassing altogether. Elements of the hermetically sealed laser 77 most prone to out-gassing include the encoder (not shown), and the transformer (not shown). Preparation and assembly of the various components of the apparatus 77 can be carried out under clean room conditions, and one or more cycles of vacuum baking and/or or baking under inert atmosphere can be carried out to remove residual moisture and volatile organic hydrocarbons from the various components prior to hermetically sealing the enclosure 77 around the external cavity laser. In particular, one or more cycles of vacuum baking, followed by purging with inert atmosphere, can be carried out on the entire assembly for the apparatus 77, including the hermetically sealable lid.

Following the final vacuum baking/inert atmosphere purge cycle, the lid is hermetically sealed onto the enclosure in the presence of an inert, moisture-controlled atmosphere such that all components within the enclosure are hermetically sealed within. Moisture control provides a dry inert gas for container 16, and ensures minimal inclusion of moisture within container 16 after sealing. Numerous methods for hermetically sealing lids to containers are known in the art and can be used. The inert atmosphere used for hermetic sealing can comprise nitrogen, argon, helium, krypton, xenon or other inert gas, or various mixtures thereof. Fill gases of particular interest are those which have minimal heat transfer.

Figure 5:
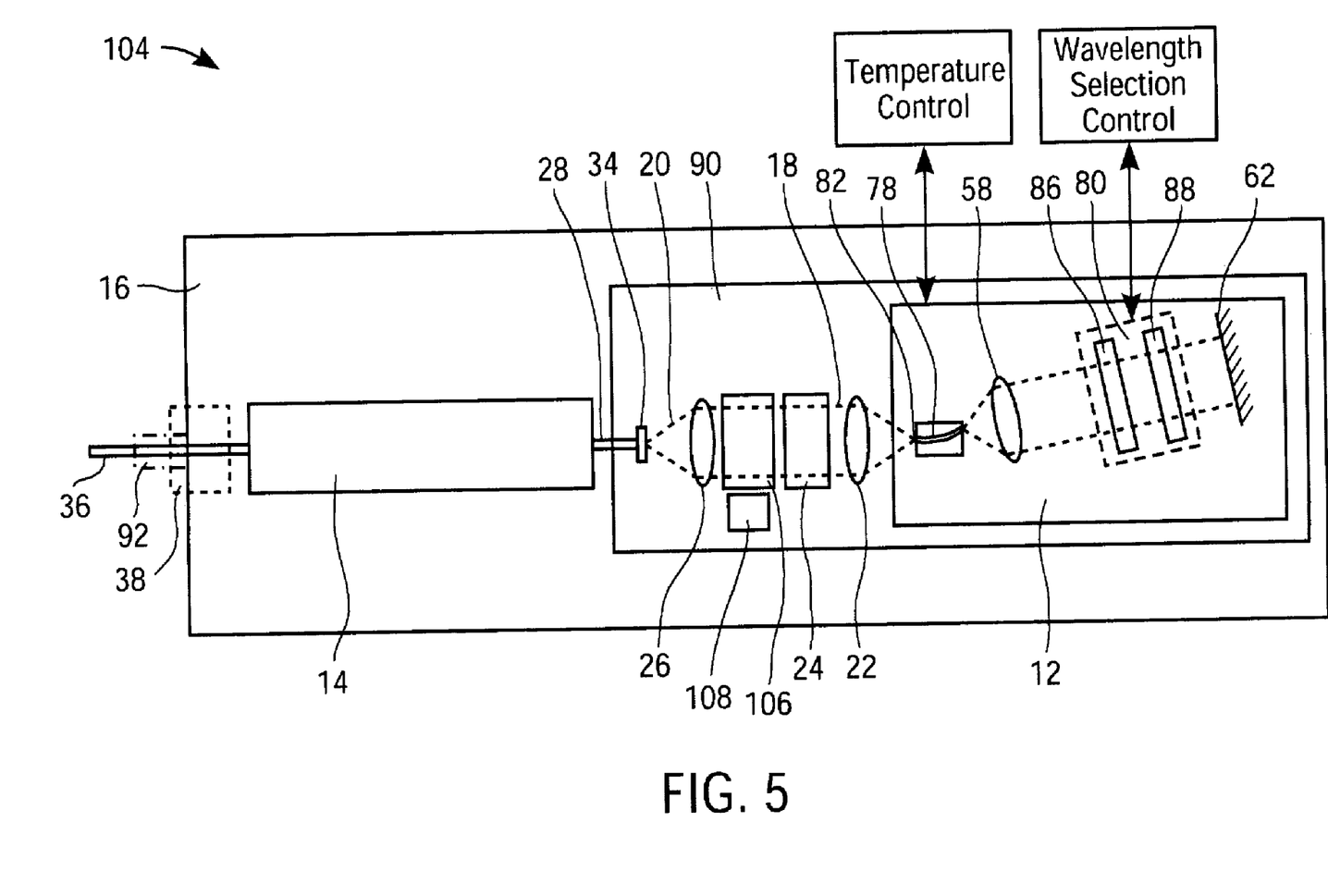
FIG. 5 is a schematic top view of another embodiment of an external cavity laser apparatus in accordance with the invention.
Figure 6:
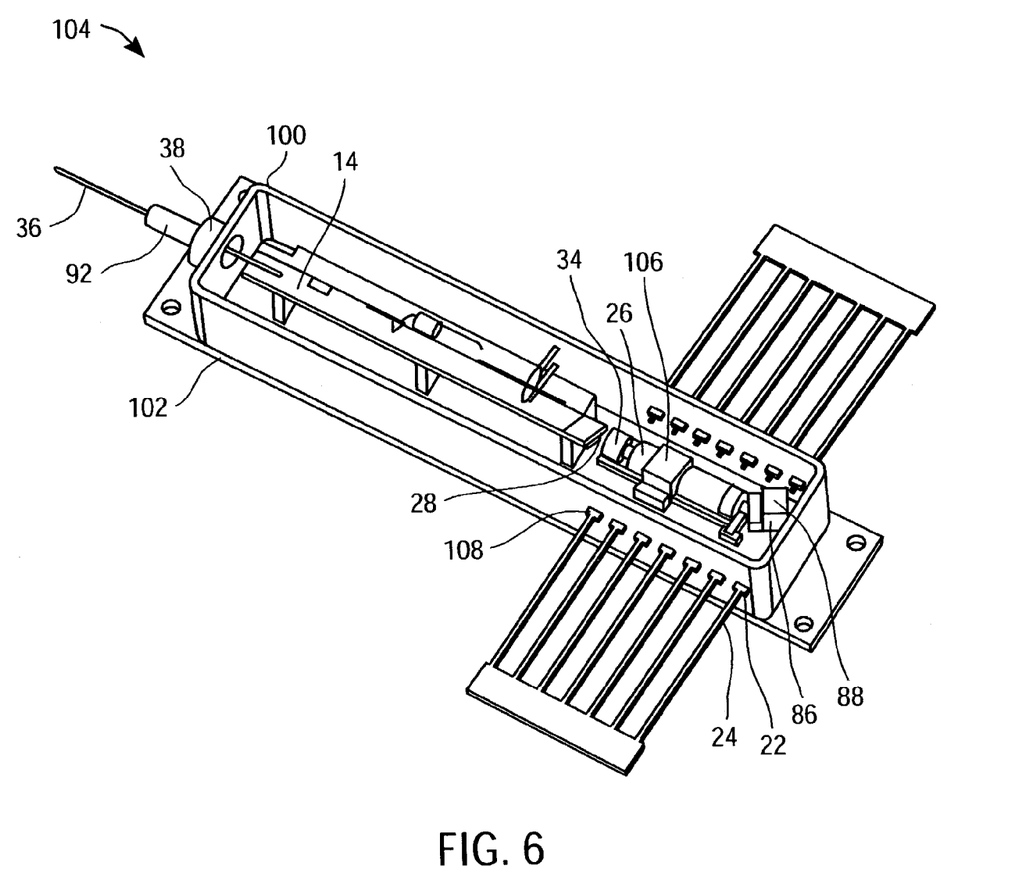
FIG. 6 is a perspective view of the laser apparatus shown in FIG. 5 in accordance with the invention, shown with the cover removed.

FIGS. 5 and 6 illustrate an alternative embodiment of the laser apparatus 104 comprising the ECDL and the modulator in series or in a straight in-line configuration, wherein like reference number relates to like parts. The ECDL 12 and the modulator 14 are mounted on a single surface of hermetically sealable container 16 in a configuration which allows the output beam 18 from facet 82 of the gain medium to follow a substantially straight output path 20 from the gain medium 78 through the optical output components and the modulator 14 to optical fiber 36. In the embodiment shown in FIGS. 5 and 6, the ECDL 12 comprises a bent wave guide gain medium 78 and a thermally controlled wavelength selection element 80 coupled to a common thermally conductive substrate or platform 90. The optical output components comprise collimating lens 22 and focusing lens 26 positioned along optical path 20 in a straight in-line configuration, unlike in the parallel laser apparatus configuration shown in FIGS. 1-4. The optical output components further comprise isolator 24 and beam splitter 106 positioned between lens 22 and 26. The beam splitter 106 is coupled to a photodector 108 for monitoring the output power of beam 18.

In the embodiment of FIGS. 5 and 6, a single platform or base 90 supports gain medium 78 and end reflector 62, as well as lenses 22, 26 and 58, beam splitter 106, isolator 24 etalons 86 and 88, photo detector 108, and other components of the apparatus 104. Use of a common platform to support the optical components of the apparatus 104 imparts vibration stability to the apparatus 104 and facilitates assembly and alignment of the gain medium 78, lenses 22, 26, 58, beam splitter 106, isolator 24 and end reflector 62, etalons 86, 88 and detector 108.

In comparison to the parallel laser apparatus 10 and 77 configuration shown in FIGS. 1-4, the straight in-line configuration of laser apparatus 102 provides a laser apparatus package size which is relatively longer and narrower than the parallel laser apparatus configuration. Depending on the ECDL or modulator to be included in the laser apparatus of the invention, as well as the specific use of the laser apparatus, the in line embodiment can be more suitable than the parallel embodiment or visa versa.

Figure 7:
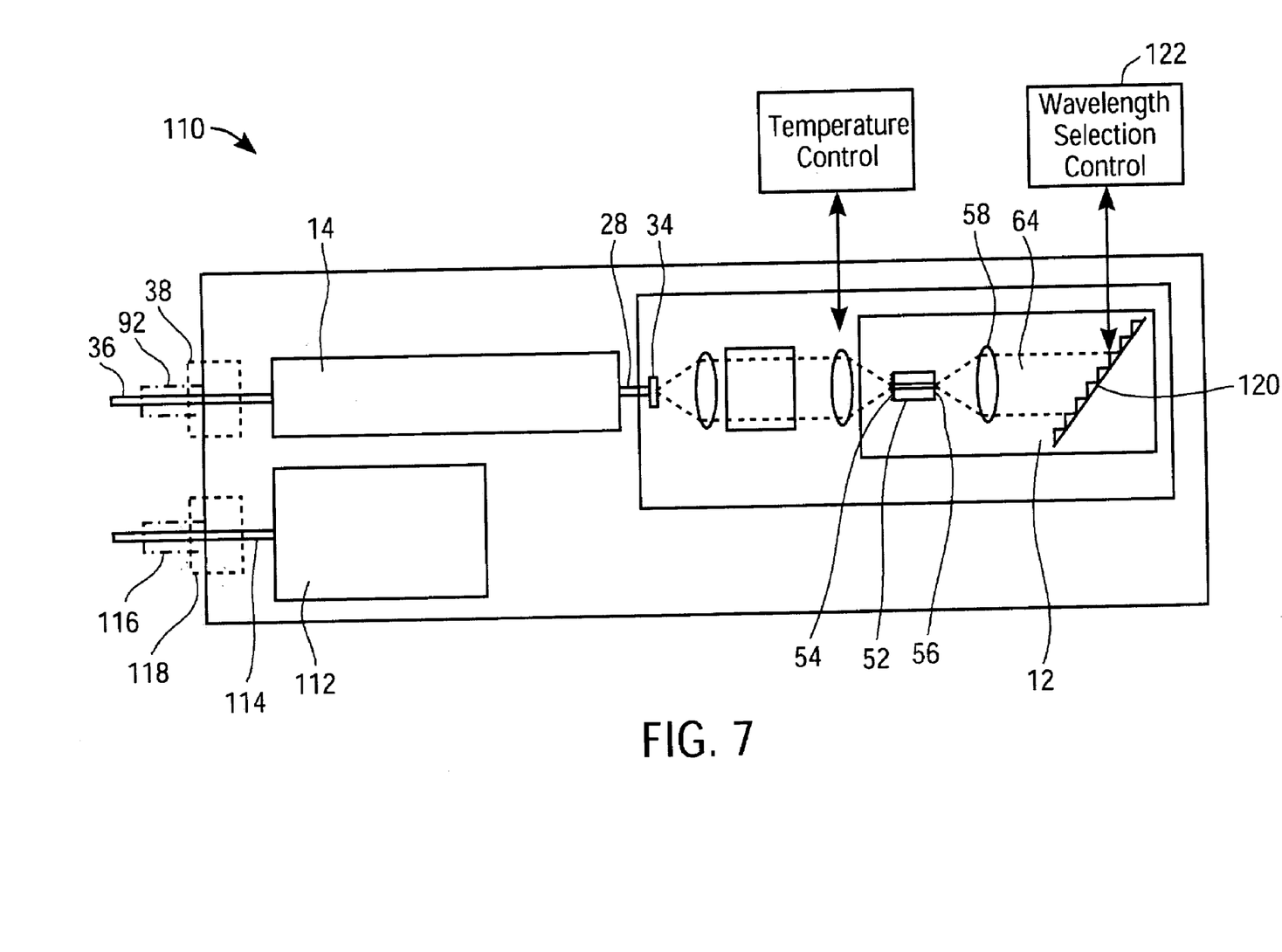
FIG. 7 is a schematic top view of another embodiment of an external cavity laser apparatus in accordance with the invention.

FIG. 7 illustrates yet another alternative embodiment of an external cavity laser apparatus 110, wherein like reference numerals denote like parts. Laser apparatus 110 comprises an ECDL 12 and a modulator 14 in a serial or straight in-line configuration, as well as a receiver 112, in hermetically sealable enclosure 16. The receiver is coupled to a receiver input or output fiber 114 which extends through the container 16. The receiver fiber 114 is hermetically sealed in a similar manner as optical fiber 36.

The hermetically sealed container 16 of the present invention comprises a receiver fiber feedthrough 116 and a ferrule 118 for hermetically sealing the receiver fiber 114 as it enters container 16. Ferrule 118 extends through the wall of container 16, with fiber 114 extending through ferrule 118. On the inner side (not shown) of container 16, fiber 114 is hermetically fused in place by a solder plug (not shown). The receiver fiber 114 and inner surface of ferrule 118 can be metallized to facilitate soldering. An epoxy plug holds fiber 114 in place adjacent the outer side (not shown) of container 16. The fiber feedthrough 116 is configured to provide pull stress support to the fiber to prevent damage from handling.

The ECDL 12 of laser apparatus 110 comprises a straight gain medium 52 with facets 54 and 56, a collimating lens 58 and a grating etalon 120. In the apparatus 110, wavelength selection is provided by a reflective grating 120, which is shown in FIG. 7 in a Littrow configuration. A Littrow arrangement allows for an end reflector or end mirror to be omitted, as the grating is positioned to return a selected diffraction directly to the gain medium 52. The grating 120 is angle-tuned via mechanical actuation by wavelength selection controller 122 to selectively feedback light at a single wavelength to gain medium 52 as a selected diffraction from grating 120. In other embodiments, an end reflector can be included with grating 120 and arranged in a Littman-Metcalf configuration with a "folded" external laser cavity. Grating 120 is partially transmissive, and a portion of beam 64 is allowed to pass through the grating 120 to wavelength reference elements (not shown) and detector (not shown), for use as a wavelength reference in accordance with the invention. The apparatus 110 also includes a grid etalon 124, which operates as a Fabry-Perot interference filter to define a plurality of transmission peaks that correspond to selectable channel wavelengths to which grating 118 can be tuned by controller 122.

The placement of receiver 112 within the hermetically sealable container with the modulator and ECDL allows for the laser apparatus 110 to have a compact footprint and to be substantially more stable to physical shock than a conventional laser apparatus having the ECDL, modulator and receiver in separate and distinct enclosures. While FIG. 7 shows a laser apparatus embodiment with the ECDL 12 and modulator 16 in a straight in-line configuration, the receiver 112 can also be enclosed with a ECDL 12 and modulator 16 in a parallel configuration.

Figure 8:
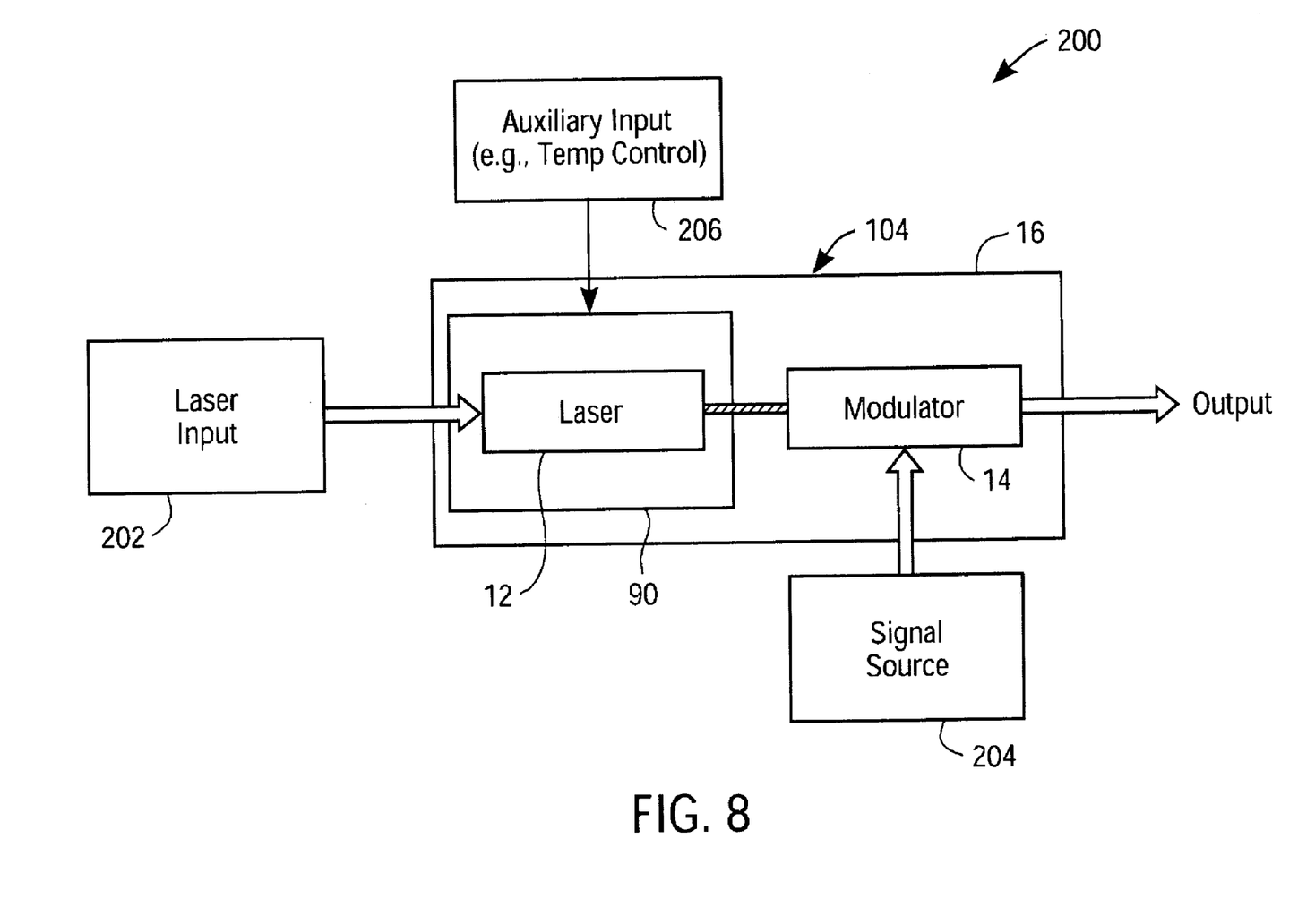
FIG. 8 is a schematic view of an embodiment of a system using an embodiment of the laser apparatus shown in FIG. 5.

FIG. 8 illustrates a system 200 using an embodiment of the laser apparatus 104, although the system 200 can use any other embodiment of the laser apparatus as well. The laser apparatus 104 includes a laser 12, mounted on a platform 90 and a modulator 14 coupled to the laser; all of these components are hermetically sealed within sealable container 16. A laser input 202 is operatively connected to the laser 12. In most cases the laser input 202 will be the source of power for the laser 12, although it can also provide other types of input to the laser, such as laser control information. A signal source 204 provides input to the modulator, for example a signal to be modulated onto the light output from the laser 12. An auxiliary input 206 provides other input needed for the operation of the laser apparatus 104 within the system, for example the current necessary to maintain the platform 90 at the desired temperature for the operation of the laser 12. The output from the laser apparatus 104 can then be routed to some destination, where it can be transmitted, further processed, etc.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A laser apparatus comprising:
   an external cavity laser having an optical output and comprising a gain medium with first and second output facets, the second output facet configured to emit a first light beam along an optical path, the first output facet configured to emit a second light beam along the optical output;
   an external modulator positioned in a parallel configuration with the external cavity laser and operatively coupled to the optical output of the external cavity laser;
   a prism positioned in the optical output, the prism positioned relative to the second light beam to provide for the parallel configuration of the external cavity laser and the external modulator; and
   a hermetically sealable container configured to enclose the external cavity laser and the external modulator in an inert atmosphere.

2. The apparatus of claim 1, further comprising:
   an optical fiber extending into the hermetically sealable container and positioned to receive optical output from the external modulator; and
   a fiber feedthrough configured to hermetically seal the optical fiber.

3. The apparatus of claim 1, further comprising an end mirror, the end mirror and the first facet of the gain medium defining an external cavity.

4. The apparatus of claim 3, further comprising a wavelength selection element positioned in the first light beam, the wavelength selection element configured to feedback light of a selected wavelength to the gain medium.

5. The apparatus of claim 4, further comprising a grid generator positioned in the first light beam.

6. The apparatus of claim 5 wherein the grid generator comprises a grid etalon.

7. The apparatus of claim 4 wherein the wavelength selection element comprises at least one of a grating or an etalon.

8. The apparatus of claim 1, further comprising a receiver in the hermetically sealable container.

9. The apparatus of claim 1, further comprising a thermally conductive platform, the external cavity laser thermally coupled to the thermally conductive platform.

10. The apparatus of claim 1, further comprising a thermally conductive platform, the external cavity laser and the optical output assembly thermally coupled to the thermally conductive platform.

11. The apparatus of claim 1, further comprising a fiber stub, the fiber stub configured to operatively couple the second light beam from the optical output assembly to the external modulator in the hermetically sealable container.

12. The apparatus of claim 1, further comprising an optical output assembly positioned between the external cavity laser and the external modulator along the optical output path, the optical output assembly operatively coupled to the gain medium in the hermetically sealed container.

13. The apparatus of claim 1, wherein the inert atmosphere is moisture controlled.

14. The apparatus of claim 1 wherein the inert atmosphere has a low thermal conductivity.

15. The apparatus of claim 1 wherein the inert atmosphere has a high thermal conductivity.

16. The apparatus of claim 1 wherein the inert atmosphere has a low heat capacity.

17. The apparatus of claim 1 wherein the inert atmosphere has a high heat capacity.

18. The apparatus of claim 1, wherein the inert atmosphere is a gas selected from nitrogen, helium, neon, argon, krypton, xenon, a nitrogen-helium mix, a neon-helium mix, a krypton-helium mix, or a xenon-helium mix.

19. The apparatus of claim 1, further comprising an activated carbon drain within the hermetically sealable container.

20. The apparatus of claim 1, further comprising a moisture trap positioned within the hermetically sealable container.

21. A method for fabricating a laser, comprising:
    providing an external cavity laser having an optical output and comprising a gain medium with first and second output facets, the second output facet configured to emit a first light beam along an optical path, the first output facet configured to emit a second light beam along the optical output;

operatively coupling an external modulator to the optical output of the external cavity laser, wherein the external modulator is positioned in a parallel configuration with the external cavity laser;

positioning a prism in the optical output, the prism positioned relative to the second light beam to provide for the parallel configuration of the external cavity laser and the external modulator; and sealing the external cavity laser and the external modulator in an inert atmosphere within a hermetically sealed container.

22. The method of claim 21 wherein the external cavity laser further comprises an end mirror, the end mirror and the first facet of the gain medium defining an external cavity, and wherein the second facet of the gain medium emits a light beam along an optical path and the end mirror is positioned in the optical path.

23. The method of claim 22, further comprising a wavelength selection element positioned in the optical path, the wavelength selection element configured to feedback light of a selected wavelength to the gain medium.

24. The method of claim 23, further comprising a grid generator positioned in the optical path.

25. The method of claim 24 wherein the grid generator comprises a grid etalon.

26. The method of claim 24 wherein the wavelength selection element comprises at least one of a grating or an etalon.

27. The method of claim 21, further comprising vacuum baking the external cavity laser prior to the hermetically sealing.

28. The method of claim 21, further comprising vacuum baking at least one high out-gassing component of the external cavity laser prior to the hermetically sealing.

29. The method of claim 21, further comprising providing an activated carbon drain in the hermetically sealed container proximate to the external cavity laser and absorbing volatile organic hydrocarbons with the activated carbon drain.

30. The method of claim 21, further comprising providing a moisture trap in the hermetically sealed container proximate to the external cavity laser and condensing moisture onto the moisture trap.

31. The method of claim 21, further comprising providing a receiver in the hermetically sealed container.

32. The method of claim 21 wherein the inert atmosphere has a low thermal conductivity.

33. The method of claim 21 wherein the inert atmosphere has a high thermal conductivity.

34. The method of claim 21 wherein the inert atmosphere has a low heat capacity.

35. The method of claim 21 wherein the inert atmosphere has a high heat capacity.

36. A laser system comprising:

an external cavity laser having an optical output and comprising a gain medium with first and second output facets, the second output facet configured to emit a first light beam along an optical path, the first output facet configured to emit a second light beam along the optical output; an external modulator positioned in a parallel configuration with the external cavity laser and coupled to the optical output of the external cavity laser;

a prism positioned in the optical output, the prism positioned relative to the second light beam to provide for the parallel configuration of the external cavity laser and the external modulator; and a hermetically sealable container configured to enclose the external cavity laser and the external modulator in an inert atmosphere;

a laser input source coupled to the external cavity laser;

a signal source coupled to the external modulator; and a output fiber connected to the external modulator and to an output destination.

37. The system of claim 36 wherein the laser input source is outside the hermetically sealable container.

38. The system of claim 36 wherein the signal source is outside the hermetically sealable container.

39. The system of claim 36 wherein the inert atmosphere is moisture controlled.

40. The system of claim 36 wherein the inert atmosphere has a low thermal conductivity.

41. The system of claim 36 wherein the inert atmosphere has a high thermal conductivity.

42. The system of claim 36 wherein the inert atmosphere has a low heat capacity.

43. The system of claim 36 wherein the inert atmosphere has a high heat capacity.

44. The system of claim 36 wherein the inert atmosphere is a gas selected from nitrogen, helium, neon, argon, krypton, xenon, a nitrogen-helium mix, a neon-helium mix, a krypton-helium mix, or a xenon-helium mix.

45. The system of claim 36, further comprising an activated carbon drain within the hermetically sealable container.

46. The system of claim 36, further comprising a moisture trap positioned within the hermetically sealable container.

* * * * *